United States Patent [19]
Horstmann

[11] Patent Number: 5,801,526
[45] Date of Patent: Sep. 1, 1998

[54] RATE ADJUSTABLE FAULTED CIRCUIT INDICATOR MODULE

[75] Inventor: Hendrik Horstmann, Ratingen, Germany

[73] Assignee: Dipl-Ing. H. Horstmann GmbH, Germany

[21] Appl. No.: 690,934

[22] Filed: Aug. 1, 1996

[51] Int. Cl.$^6$ .................. G01R 1/64; G01R 19/14
[52] U.S. Cl. .......... 324/133; 324/117 R; 324/126
[58] Field of Search ............... 324/115, 133, 324/126, 117 R, 117 H; 340/650

[56] References Cited

U.S. PATENT DOCUMENTS

| | | | |
|---|---|---|---|
| 4,034,360 | 7/1977 | Schweitzer | 324/133 |
| 4,296,376 | 10/1981 | Bartol | 324/133 |
| 4,536,758 | 8/1985 | Schweitzer | 324/133 |
| 4,794,331 | 12/1988 | Schweitzer | 324/133 |
| 5,221,894 | 6/1993 | Herwig | 324/117 R |

Primary Examiner—Vinh P. Nguyen
Assistant Examiner—Jose M. Solis
Attorney, Agent, or Firm—Davis Chin

[57] ABSTRACT

A faulted indicator elbow-type termination connector for indicating the occurrence of a fault current in an electrical conductor of an alternating current distribution power system includes means for producing a magnetic field in response to an applied current to the electrical conductor. The termination connector includes a cylindrical body portion having a recessed housing section which projects radially from a central axis thereof. A faulted circuit indicator module is rotatably mounted within the recessed housing section and contains a trip setting device which is responsive to the magnetic field. The trip setting device has its sensitivity adjusted by rotating the faulted circuit indicator module relative to the cylindrical body portion. As a result, the sensitivity of the trip setting device can be changed quickly and easily so as to accommodate various trip settings.

20 Claims, 3 Drawing Sheets

RATE ADJUSTABLE FAULTED CIRCUIT INDICATOR MODULE

BACKGROUND OF THE INVENTION

This invention relates generally to circuit condition indicators for use with elbow-type connectors employed in power distribution systems. More particularly, it relates to a faulted circuit indicator module which is rotatably mounted in an elbow-type termination connector for varying the sensitivity of a sensing device in an effective and efficient manner.

As is generally known in the art, during the typical operation of an electrical power distribution system it is frequently desirable to monitor circuit parameters such as current and voltage in cables carrying alternating current at high voltage levels in order to detect the occurrence of a fault current or loss of voltage at a particular location. These cables are suitably interconnected to various system components such as transformers, switch and junction panels by means of plug-in termination connectors which snap onto a complementary terminal on such components. The termination connectors of this type often include one or more test points for capacitively coupling test or circuit condition indicating devices such as fault indicators to the conductor of the connector.

Heretofore, there exists various types of fault indicators for use in detecting faults in electrical power distribution systems. One such prior art circuit condition monitoring system is described and illustrated in U.S. Pat. No. 4,904,932 to E. O. Schweitzer, Jr. issued on Feb. 27, 1990, which is hereby incorporated by reference in its entirety. The '932 patent disclosed in FIGS. 1 through 4 a circuit condition monitoring system for an electrical power distribution system which includes a system connector component 10 having an integral test point socket 18 within which a fault indicator module 20 is received. The fault indicator module 20 serves to provide fault current or voltage loss monitor of a system conductor 11 extending generally axially through the connector 10.

The module 20 includes an electrically non-conductive transparent housing 22 within which the electrical components of the fault indicator are contained. A disc-shaped insulator board 23 is positioned perpendicularly to the axis of the housing at a location intermediate the ends thereof, and a layer 24 of epoxy material is provided at the inside end of the housing for securing the insulator board 23 in place. Further, the electrical components disposed within the housing includes a first capacitive coupling element 25 for capacitively coupling the circuitry of the fault indicator to the conductor 11, a reed switch 26 for sensing the occurrence of a fault current in the conductor, an indicator flag assembly 27 for visually indicating the occurrence of the fault current, and a magnetic winding assembly 28 for actuating the indicator flag assembly.

The prior art circuit condition monitoring system of the '932 patent suffers from the disadvantage that the contacts of the reed switch 26 are fixedly positioned within the housing 22 so as to be in a given proximity to the conductor 11 when the module 20 is seated in the test socket 18. As a consequence, the sensitivity (the amount of trip current level in excess of the normal current condition required to indicate a fault occurrence) of the reed switch contact is fixed and is not adjustable once the module is seated in the test socket. In other words, the module 20 permits only one trip setting response in the monitoring system (i.e., a trip current level of 200 amperes). If a different trip setting response (i.e., 400 amperes setting) is desired, the module 20 must be removed and replaced with a new one.

It would therefore be desirable to provide a faulted circuit indicator module having a sensing device whose sensitivity can be changed quickly and easily so as to accommodate various trip settings. It would also be expedient to provide coupling means to the visual indicator so as to permit the observation of the visual indicator at a remote location. The faulted circuit indicator module of the present invention is rotatably mounted in the test socket of an elbow-type termination connector so as to change the alignment of a sensing device relative to the plane of the magnetic field of the conductor being monitored. The present invention represents a significant improvement over the prior art circuit monitoring system of the '932 patent.

SUMMARY OF THE INVENTION

Accordingly, it is a general object of the present invention to provide an improved faulted circuit indicator module for use in a termination connector which is relatively simple and economical to manufacture and assemble, but yet overcomes the disadvantages of the prior art fault indicators.

It is an object of the present invention to provide an improved faulted circuit indicator module for use in a termination connector which includes means for adjusting quickly and easily its sensitivity.

It is another object of the present invention to provide an improved faulted circuit indicator module for use in a termination connector which includes coupling means to a visual indicator so as to permit its observation at a remote location.

It is still another object of the present invention to provide an improved faulted circuit indicator module which is rotatably mounted in an elbow-type termination connector for varying the sensitivity of a sensing device in an effective and efficient manner.

In accordance with these aims and objectives, the present invention is concerned with the provision of a fault indication elbow-type termination connector for indicating the occurrence of a fault current in an electrical conductor of an alternating current distribution power system which includes means for producing a magnetic field in response to an applied current to the electrical conductor. The termination connector includes a cylindrical body portion having a recessed housing section which projects radially from a central axis thereof. A faulted circuit indicator module is rotatably disposed within the recessed housing section and contains a trip setting device responsive to the magnetic field. The trip setting device has its sensitivity being adjustable by rotating the faulted circuit indicator module relative to the cylindrical body portion.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
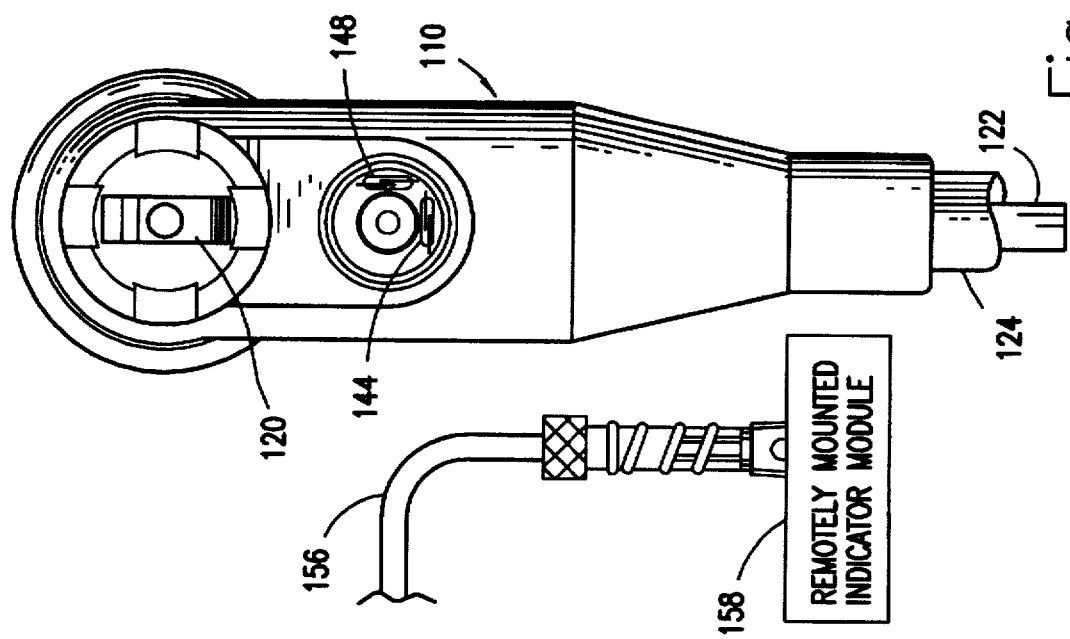
FIG. 2 is a cross-sectional view, taken along the lines 2—2 of FIG. 1.
Figure 1:
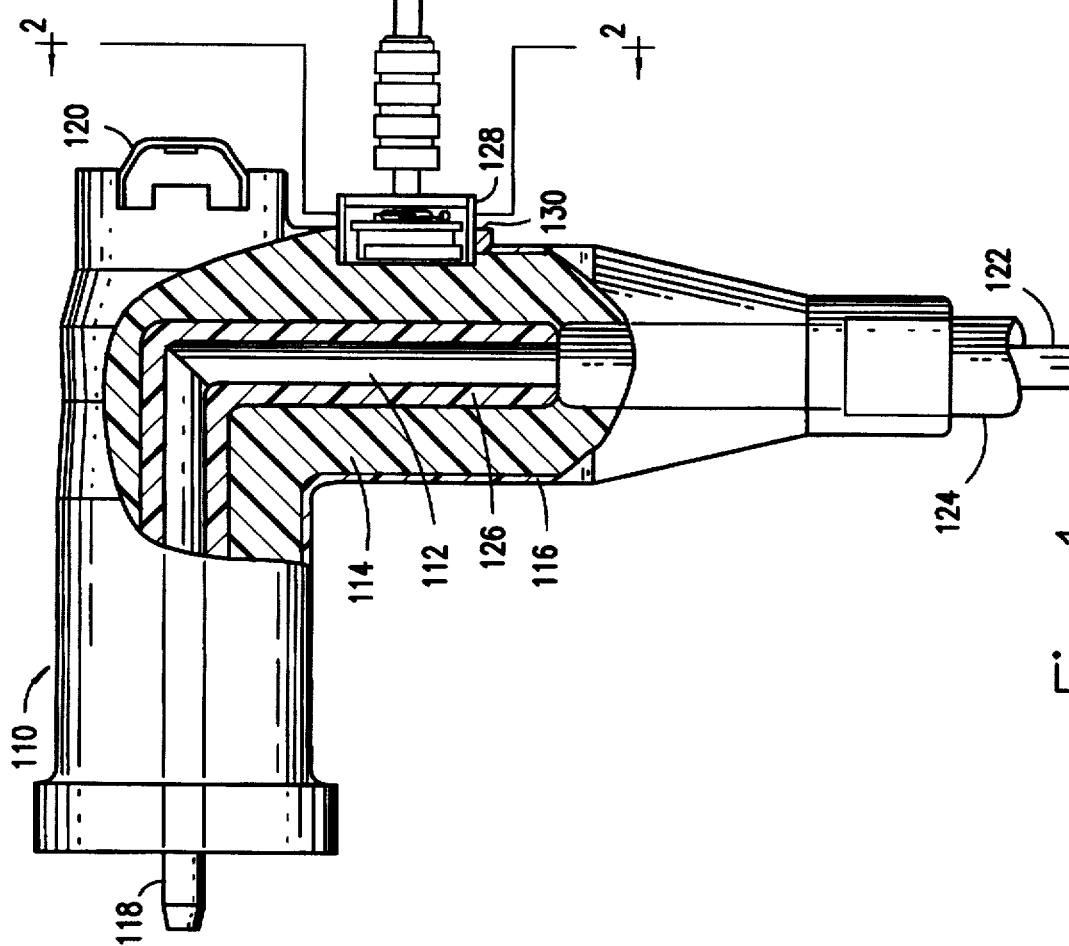
FIG. 1 is a side elevational view, partly in section, of an elbow-type termination connector having an improved faulted circuit indicator module, constructed in accordance with the principles of the present invention.
Figure 3:
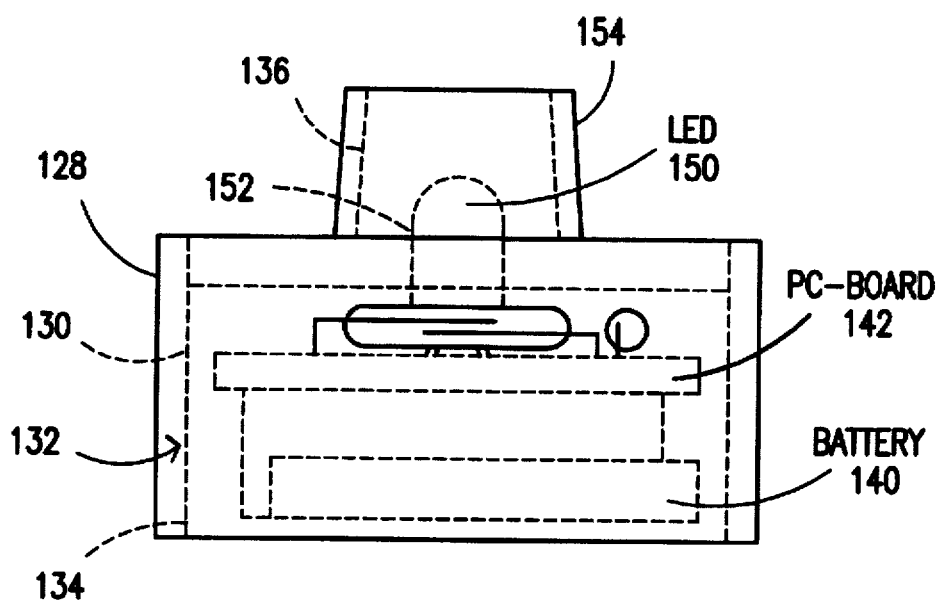
FIG. 3 is an enlarged, cross-sectional view of the test point socket of FIG. 1 with the faulted circuit indicator module 130 rotatably mounted therein.
Figure 4:
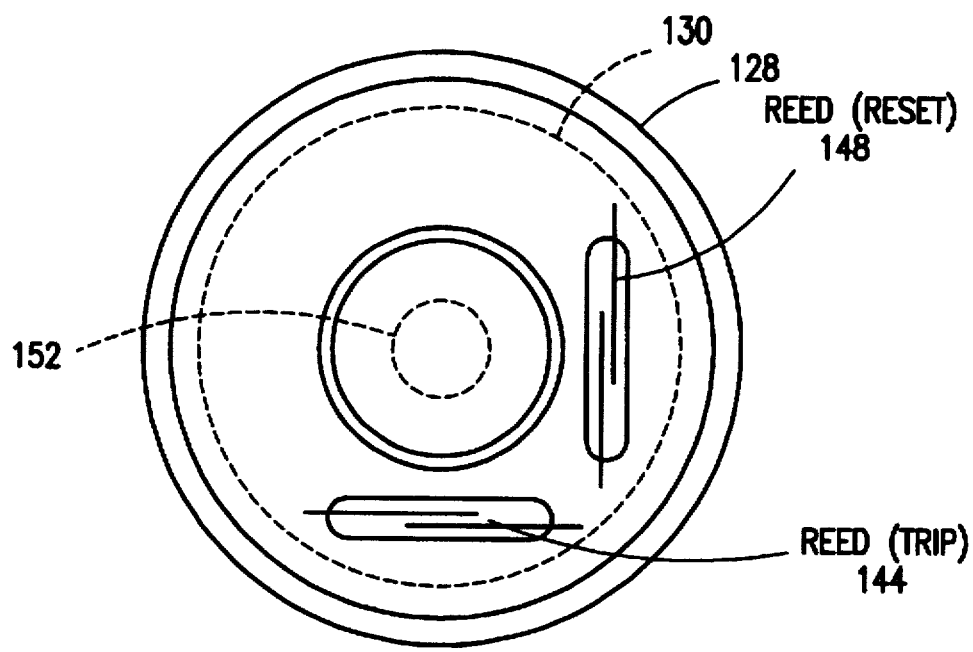
FIG. 4 is an enlarged, front plan view of the recessed housing section of FIG. 2.

Referring now to the various views of the drawings, there is shown in FIGS. 1 and 2 a plug-in elbow termination connector for use in high voltage alternating current power distribution systems for establishing a plug-in connection to a transformer (not shown) or other system component and is designated generally by reference numeral 110. As illustrated, the elbow-type termination connector 110 includes a conductor 112 extending generally axially through an electrically non-conductive body member 114 which is encased in an electrically conductive sheath 116. The sheath 116 is grounded in accordance with conventional practice. An electrically-conductive contact member 118 extends from the conductor 112 so as to mate with a complementary contact formed on the associated system component.

An arcuate member 120 having ends thereof anchored in the conductive sheath 116 extends from the connector 110 to receive the hooked end of a lineman's tool. The axial connector 112 is typically connected to the conductor 122 of a flexible cable 124 of the type commonly utilized in power distribution systems. A layer 126 of semi-conductive material may be provided around the conductor 112 in order to provide stress relief within the conductor, as is generally well-known to those skilled in the art. As thus far described, the plug-in elbow-type termination connector 110 is quite conventional in nature.

The present invention resides in the fact that a test point socket defined by a recessed housing section 128 is provided which projects radially from the central axis of a central body portion of the connector 110. The recessed housing section 128 is utilized to receive an improved novel faulted circuit indicator module 130, constructed in accordance with the principles of the present invention, for detecting fault currents or voltage loss in the conductor 112. The housing section 128 has a generally cylindrically-shaped construction and has an inner diameter which is slightly larger than the outer diameter of the faulted circuit indicator module 130. The housing section has an axial length so as to enclose substantially the entire module 130 when it is positioned therein for rotational movement.

The faulted circuit indicator module is formed of a generally cylindrical member 132 having a closed front end 134 and a reduced annular neck portion 136 formed integrally with the back end thereof. The cylindrical member 132 houses the various electrical components to provide the monitoring and indicating functions of the faulted circuit indicator. As illustrated, the cylindrical member 132 contains a power source such as a battery 140 and a printed circuit board 142. The printed circuit board has mounted thereon trip reed switch contacts 144, reset reed switch contacts 148, and a visual indicator such as a light-emitting diode 150. It will be noted that the light-emitting diode extends through a window 152 in the back end of the cylindrical member 132 and into the neck portion 136. The neck portion is covered by a transparent cover 154 so that the energized light-emitting diode will be observable.

It should be apparent to those skilled in the art that various devices and circuit arrangements may be employed to provide the monitoring and indicating functions. A schematic circuit diagram of an electrical circuitry suitable for use with the faulted circuit indicator module 130 for detecting the occurrence of a fault current in the conductor 112 through closure of the contacts of the trip reed switch 144 is depicted in U.S. Pat. No. 4,101,826 issued on Jul. 18, 1978, to H. Horstmann. Alternatively, the trip reed switch contacts 144 may be replaced by a coil for detecting the occurrence of a fault current. In this case, a schematic circuit diagram suitable for use with a coil for detecting the occurrence of a fault current is shown in U.S. Pat. No. 5,168,414 issued on Dec. 1, 1992, to H. Horstmann. The '826 and '414 patents are hereby incorporated by reference in their entirety.

Figures 5, 6:
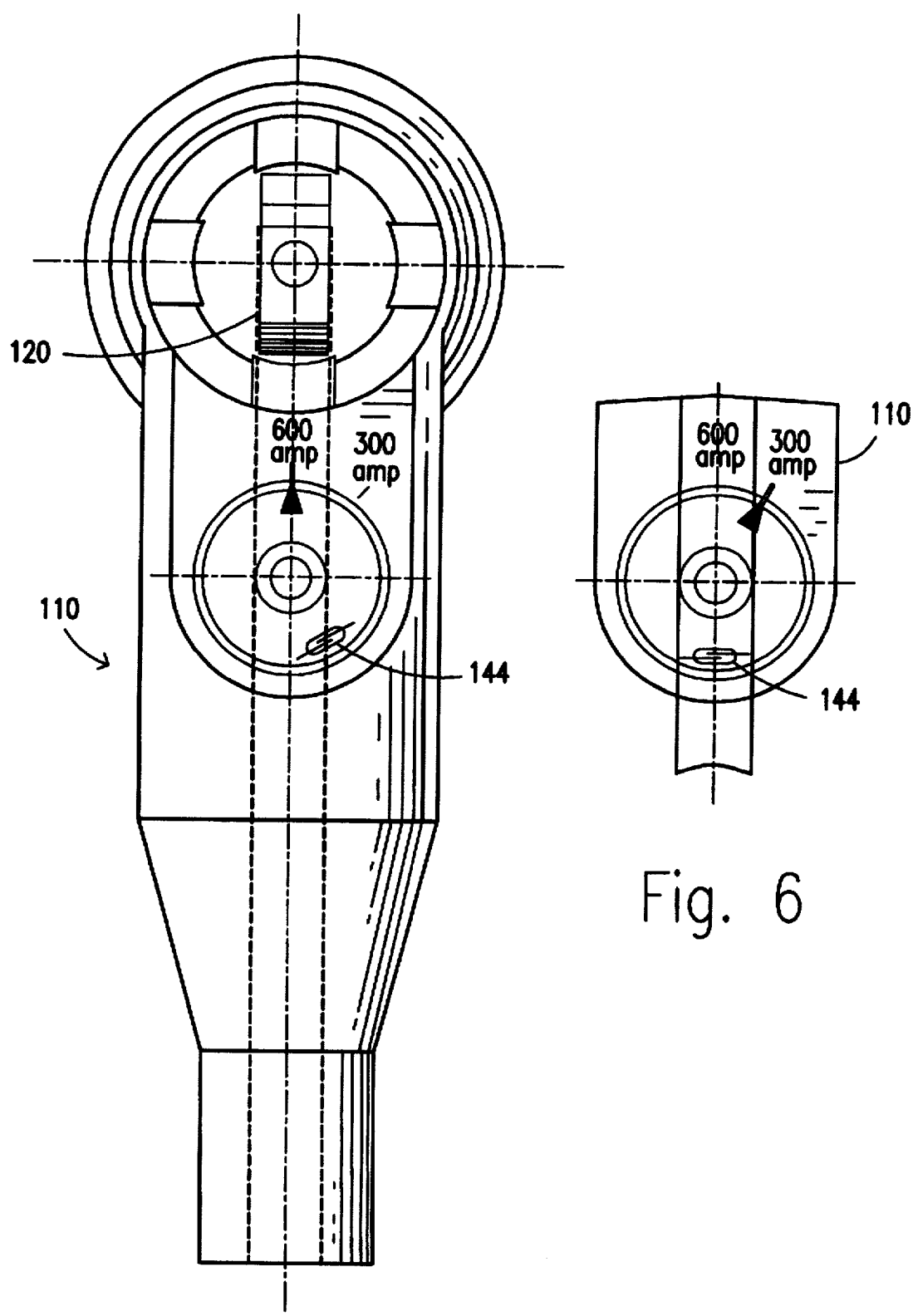
FIG. 5 is a view, similar to FIG. 2, illustrating the position of the sensing device for a maximum sensitivity of 600 amperes setting.
FIG. 6 is a view, similar to FIG. 5, illustrating the position of the sensing device for a sensitivity of 300 amperes setting.

By reason of the novel construction of the faulted circuit indicator module 130 which is rotatably mounted within the recessed housing section 128, the sensitivity or the trip current for response of the fault indicator can be adjusted or changed quickly and easily so as to accommodate various trip current settings. In FIG. 6, the fault location has a maximum response sensitivity (a relatively low trip current in the conductor 112 such as 300 amperes) where the contacts of the reed switch 144 are positioned in and are in full alignment with the magnetic field lines generated by the current flowing in the conductor 112. In other words, since the trip reed switch 144 is most responsive to the applied magnetic flux in a plane common to the switch 144 and perpendicular to the axis of the conductor 112, a greater portion of the magnetic flux around the conductor 112 will be acting upon the reed switch 144. Thus, the fault indicator is rendered more sensitive to the current flowing in the conductor 112.

By simply rotating the faulted circuit indicator module 130 containing the trip reed switch 144 to the position shown in FIG. 5, the faulted indicator can be desensitized by increasing the setting for the trip current. As depicted, the trip setting has been increased to 600 amperes from the maximum sensitivity of 300 amperes shown in FIG. 6. By rotating continuously the faulted circuit indicator module 130 in the counterclockwise direction, the sensitivity can be placed in a number of settings. In order to facilitate the adjustment to the desired trip setting, the current ratings can be labeled or applied directly onto the surface of the central body portion of the termination connector 110 and an arrow may be used on the module 130 for alignment with the current rating labels. In addition, in order to provide for visual indication of a fault current at a remote location, the light-emitting diode may be coupled by a fiber optics cable 156 for connection to a visual-type remotely-mounted indicator module 158, as illustrated in FIG. 1.

From the foregoing detailed description, it can thus be seen that the present invention provides an improved faulted circuit indicator module for use in a termination connector. The faulted circuit indicator module of the present invention is rotatably mounted in the cylindrical body portion of the termination connector for varying the sensitivity of a trip setting device. As a result, the sensitivity can be changed quickly and easily so as to accommodate various trip settings.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A fault indicator elbow-type termination connector for indicating the occurrence of a fault current in an electrical conductor of an alternating current distribution power system, comprising:

means for producing a magnetic field in response to an applied current to the electrical conductor;

cylindrical body portion means including a recessed housing section projecting radially from a central axis thereof;

a faulted circuit indicator module rotatably mounted within said recessed housing section and containing trip setting means responsive to the magnetic field; and said trip setting means having its sensitivity being adjustable by rotating said faulted circuit indicator module relative to said cylindrical body portion means.

2. A termination connector as claimed in claim 1, wherein said trip setting means is comprised of a reed switch having contacts.

3. A termination connector as claimed in claim 2, wherein the contacts of said reed switch are positioned in and in full alignment in a first position with the magnetic field so as to provide a maximum sensitivity.

4. A termination connector as claimed in claim 3, wherein said maximum sensitivity has a trip current setting of approximately 300 amperes.

5. A termination connector as claimed in claim 4, wherein the contacts of said reed switch are moved from the first position to a second position so as to increase its sensitivity by increasing the setting for the trip current.

6. A termination connector as claimed in claim 5, wherein the sensitivity in the second position has a trip current setting of approximately 600 amperes.

7. A termination connector as claimed in claim 1, further comprising visual-indicating means disposed in said recessed housing section to provide a visible flashing light upon the occurrence of a fault current.

8. A termination connector as claimed in claim 7, wherein said flashing light is a light-emitting diode.

9. A termination connector as claimed in claim 8, further comprising remote indication means coupled to said light-emitting diode for producing a visual indication at a remote location.

10. A termination connector as claimed in claim 9, further comprising a visual-type indicator module being coupled to the light-emitting diode by a fiber optics cable.

11. A fault indicator elbow-type termination connector for indicating the occurrence of a fault current in an electrical conductor of an alternating current distribution power system, comprising:

means for producing a magnetic field in response to an applied current to the electrical conductor;

cylindrical body portion means including a recessed housing section projecting radially from a central axis thereof;

trip setting means responsive to the magnetic field and being rotatably disposed within said recessed housing section; and said trip setting means having its sensitivity being adjustable by its rotation relative to said cylindrical body portion means.

12. A termination connector as claimed in claim 11, wherein said trip setting means is comprised of a reed switch having contacts.

13. A termination connector as claimed in claim 12, wherein the contacts of said reed switch are positioned in and in full alignment in a first position with the magnetic field so as to provide a maximum sensitivity.

14. A termination connector as claimed in claim 13, wherein said maximum sensitivity has a trip current setting of approximately 300 amperes.

15. A termination connector as claimed in claim 14, wherein the contacts of said reed switch are moved from the first position to a second position so as to increase its sensitivity by increasing the setting for the trip current.

16. A termination connector as claimed in claim 15, wherein the sensitivity in the second position has a trip current setting of approximately 600 amperes.

17. A termination connector as claimed in claim 11, further comprising visual-indicating means disposed in said recessed housing section to provide a visible flashing light upon the occurrence of a fault current.

18. A termination connector as claimed in claim 17, wherein said flashing light is a light-emitting diode.

19. A termination connector for indicating the occurrence of a fault current in an electrical conductor of an alternating current distribution power system, comprising:

recessed housing means formed in said termination connector; and trip setting means responsive to a magnetic field and being rotatably disposed in said recessed housing means.

20. A termination connector as claimed in claim 19, wherein the sensitivity of the trip setting means is adjusted by its rotation relative to said recessed housing means.

* * * * *